United States Patent
Yushio et al.

(10) Patent No.: US 6,423,400 B1
(45) Date of Patent: Jul. 23, 2002

(54) SUSCEPTOR FOR SEMICONDUCTOR MANUFACTURING EQUIPMENT AND PROCESS FOR PRODUCING THE SAME

(75) Inventors: Yasuhisa Yushio; Hirohiko Nakata; Masuhiro Natsuhara, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/260,003

(22) Filed: Mar. 2, 1999

(30) Foreign Application Priority Data

Mar. 2, 1998 (JP) .......................................... 10-049283
Feb. 23, 1999 (JP) .......................................... 11-044544

(51) Int. Cl.$^7$ ............................................. H01L 21/68
(52) U.S. Cl. ...................... 428/210; 219/634; 428/325; 428/408; 428/432; 428/469; 428/472; 428/698; 428/901
(58) Field of Search ................................. 428/701, 702, 428/698, 469, 412, 408, 901, 210, 325, 432; 501/98.4; 219/634

(56) References Cited

U.S. PATENT DOCUMENTS

| | | | | |
|---|---|---|---|---|
| 4,766,097 A | * | 8/1988 | Shinazaki et al. | 501/96 |
| 4,803,183 A | * | 2/1989 | Schwetz et al. | 501/96 |
| 4,840,853 A | * | 6/1989 | Iio et al. | 428/698 |
| 5,034,357 A | * | 7/1991 | Yamakawa et al. | 501/98 |
| 5,063,183 A | * | 11/1991 | Taniguchi et al. | 501/96 |
| 5,272,009 A | * | 12/1993 | Schachner et al. | 428/408 |
| 5,306,895 A | | 4/1994 | Ushikowski et al. | 219/385 |
| 5,370,907 A | * | 12/1994 | Yamakawa et al. | 427/376.3 |
| 5,424,261 A | * | 6/1995 | Harris et al. | 428/901 |
| 5,529,852 A | * | 6/1996 | Sasame et al. | 428/209 |
| 5,998,321 A | * | 12/1999 | Katsuda et al. | 501/98.4 |
| 6,001,760 A | * | 12/1999 | Katsuda et al. | 501/98.4 |
| 6,005,778 A | * | 12/1999 | Spielberger | 361/770 |
| 6,017,485 A | * | 1/2000 | Enck et al. | 264/618 |
| 6,036,809 A | * | 2/2000 | Kelly et al. | 156/247 |

FOREIGN PATENT DOCUMENTS

| | | |
|---|---|---|
| EP | 0330848 A1 | 9/1989 |
| EP | 0486966 A1 | 5/1992 |
| EP | 0798278 A2 | 10/1997 |
| EP | 0882689 A2 | 12/1998 |
| JP | 5-63435 | 9/1993 |
| JP | 9/87051 | 3/1997 |
| JP | 09-213777 | 8/1997 |

OTHER PUBLICATIONS

"Ceramics", vol. 30, No. 11, pp. 999–1001, 1995.
European Search Report dated Oct. 30, 2000.

* cited by examiner

Primary Examiner—Archene Turner
(74) Attorney, Agent, or Firm—McDermott, Will & Emery

(57) ABSTRACT

A susceptor for semiconductor manufacturing equipment obtained by laminating plural aluminum nitride (AlN) ceramic substrates with a high melting point metallic layer and an adhesive layer, and in particular, the aluminum nitride (AlN) ceramic substrate contains a compound of a Group 3a element in an amount of from 0.01 to 1% by weight in terms of the element, and the balance consisting essentially of aluminum nitride (AlN), in which the average particle size of an AlN crystal is from 2 to 5 μm. The susceptor is prepared by obtaining substrates from a mixture of the material powders through the steps of molding, sintering in a non-oxidizing atmosphere at 1,600 to 2,000° C. and forming into a desired substrate shape, and then laminating a plurality of the thus obtained substrate with a high melting point metallic layer and an adhesive layer inserted between the substrates, firing the laminate in a non-oxidizing atmosphere at 1,500 to 1,700° and finishing the fired laminate.

14 Claims, 1 Drawing Sheet

SUSCEPTOR FOR SEMICONDUCTOR MANUFACTURING EQUIPMENT AND PROCESS FOR PRODUCING THE SAME

BACKGROUND OF THE INVENTION

1. Field of the Invention

The present invention relates to a susceptor for semiconductor manufacturing equipment which retains a semiconductor raw material by means of electrostatic charge, and more particularly, a susceptor for semiconductor manufacturing equipment formed by laminating plural aluminum nitride ceramic substrates with a high melting point metallic layer and an adhesive layer, the susceptor being used for a surface treatment of a silicon semiconductor wafer material.

2. Description of the Background Art

In the production of an LSI, an integrated circuit having fine wiring patterns is formed on the surface of a silicon semiconductor wafer. In order to establish an electrical insulation between the wiring patterns, an insulating film of silicon dioxide, silicon nitride or the like is formed by using various CVD means, such as plasma CVD, normal pressure CVD, etc. Hereinafter, this is referred to as "surface treatment". In this surface treatment, the wafer is treated one by one and a susceptor for retaining the wafer is required. This will be explained about the case of an electrostatic chuck method using a ceramic susceptor (chuck) by way of example. As schematically shown in FIG. 1, a semiconductor wafer 2 is placed on the susceptor 1. Reference numeral 9 denotes a thick-film electrode for endowing an electrostatic chucking function by applying an electric field to the susceptor through a direct current power source 10. The electrode is generally composed a metallic layer of a high melting point metal such as W, Mo, etc. In general, a heater 3 for heating up the wafer 2 is provided under the susceptor. A direct current power source 7 gives an electric field to an electrode 6 and a CVD material gas 4 is supplied in a vacuum chamber 5 from an upside of the susceptor 1, and plasma 8 is electrically generated. In such a manner, a film as mentioned above is formed on the surface of the wafer 2. The susceptor is required to have a high thermal conductivity, so as to rapidly conduct heat from the heater, so that the wafer uniformly heated. Further, in order to retain the retaining position of the wafer with a high precision, the susceptor is required to have a high dimensional precision.

A fairly high direct current voltage (generally about 1 kV) must be applied between the electrode for chucking and the ground. For this, the aforesaid thick-film electrode is formed. A method for this film formation includes the so-called co-fire metallizing method and the so-called post-fire metallizing method. The former is a method, in which a layer of a material comprising mainly the high melting point metal is formed (generally by printing and coating a conductive paste) on a green body (green sheet) of ceramic powder, followed by laminating, and the ceramics and the high melting point metallic layer are simultaneously sintered. The later is a method, in which a layer of a raw material comprising mainly a high melting point metal is formed (generally by printing and coating a conductive paste) on a substrate composed of a sintered ceramic body and then several these sintered bodies are laminated. Further, the high melting point metallic layer is fired by sintering. The former is advantageous in producing a multilayer wiring substrate for a semiconductor device at a low cost as compared with the latter. However, in the former method, since a large number of thin sheets are laminated, the resultant sintered bodies are subjected to a large deformation. Therefore, this method is undesirable when a susceptor having a large outer diameter and a high dimensional precision is desired.

The outer diameter of a wafer to be surface-treated is rapidly becoming large. Therefore, the size of a susceptor for holding it is also required to be large and, in the case of a circular shaped susceptor, the currently required size is 200 to 300 mm in diameter and its thickness is generally about 5 to 50 mm. However, it is considered that a susceptor having a larger diameter will be demanded in the future. Also, with the increasing trend toward fine and highly dense wiring on wafers, it will be increasingly important to ensure a high precision in the arrangement of wiring patterns. Therefore, the precision of the retaining position of the wafer should be highly improved, and the dispersion of the thickness of the susceptor in the direction of the main plane and the demanded tolerance of the flatness are becoming severe. For example, there is a severe demand in that when the outer diameter is 200 mm and the thickness of 5 mm, the allowable tolerance of the thickness is plus/minus several tens $\mu$m and that of the flatness is about 100 $\mu$m. As described above, there is a strong demand for larger suceptors with a higher dimensional precision. Therefore, there are difficulties in applying conventional production processes of multilayer wiring substrates for semiconductor devices without modifications.

The mode for retaining (chucking) a wafer includes a mechanical method chucking mechanically, an electrostatic chucking method using electrostatic charge, and a vacuum suction method sucking with vacuum. Among them the mechanical method has been mainly used in which an aluminum (Al) article that has an enhanced corrosion resistance to plasma by forming an anodic oxide film is used as a susceptor. However, in recent years the spacing between wirings is narrower with rapid increase in density of an LSI. When the wafer or susceptor is corroded by plasma, they generate dusts. If the dusts are adhered on the wafer as contaminants, there is a serious problem in that the wiring patterns of an LSI is broken and forms short circuit, to decrease the yield of the wafer. In order to avoid this problem, it is required to use a susceptor having a superior corrosion resistance to a raw material gas or often clean a chamber. Cleaning means removing the dusts by using a gas, such as $NF_3$, $CF_4$, etc., which has a higher corrosion activity than the raw material gas and reacts with the dusts and such a gas is hereinafter referred as "reaction medium" or simply as "medium". The above-mentioned susceptor made of aluminum is liable to be corroded by the medium. Accordingly, in order to solve the problems, an electrostatic chuck method using ceramics having excellent corrosion resistance as a susceptor has been used in recent years, as described in *Ceramics,* vol. 30, No. 11, p. 999 to 1001 (hereinafter, the ceramic susceptor used in this method is called "an electrostatic chuck" or simply called "a chuck").

As described in the foregoing article, a material suitable as such a electrostatic chuck includes ceramics composed mainly of alumina ($Al_2O_3$), aluminum nitride (AlN), boron nitride (BN), etc. Among these, aluminum nitride-based ceramics comprising mainly aluminum nitride (AlN) (hereinafter simply called "aluminum nitride" or "AlN") is excellent in corrosion resistance to the medium and also is excellent in thermal conductivity. When aluminum nitride ceramics is sufficiently densified, for example, defects such as pores are extremely small to have a density of 98% of the theoretical density, it has a high corrosion resistance to a fluorine compound and the amount of dusts generated from the chuck can be largely decreased. Accordingly, the contamination of the wafer described above can also be prevented, and simultaneously the life of the chuck itself can be prolonged. Due to its high thermal conductivity, even when the outer diameter of a wafer becomes large, uniform heating of the wafer is relatively rapidly conducted owing to its quick uniform heating. In order to form a circuit having fine patterns with uniform quality and thickness, it is necessary to precisely control the surface temperature of a wafer. Accordingly, the electrostatic chuck made of aluminum nitride ceramics is being spread quickly.

A method for the preparation of such a ceramic substrate includes a method in which thin molded bodies (green sheets) are laminated and sintered and a method in which relatively thick bodies (compacts) are sintered. For example, in order to obtain an electrostatic chuck having a thickness of 5 mm by the former method, 10 sheets or more of thin green sheets having a thickness of approximately 0.5 mm are prepared and laminated. In this case, a large amount of an organic binder is required to be incorporated into the thin sheets in order to retain the shape thereof. Therefore, the proportion of volatile components which are driven off during the firing step is increased and the sintering shrinkage becomes considerably large. For example, in the case of aluminum nitride which per se shows a relatively large shrinkage on sintering, when it is sintered in a such manner, considerable warp or deformation cannot be avoidably occurs and thereby adhesion among the individual lamination units becomes insufficient. As a result, the lamination interface of the sintered laminate is liable to be peeled (hereinafter, also referred to as "void"). The dispersion of shrinking percentage in the main plane is generally about 1%. However, if the deformation is large, a finishing treatment for a long period of time in the main plane is required in order to meet the severe requirement for high dimensional precision. Further, the dispersion in thickness in the direction of the main plane of the finished body becomes large. Furthermore, thick-film electrodes (shown at 9 in FIG. 1) interposed between ceramic substrate layers will be deformed corresponding to the deformation of ceramics. For example, the electrodes are formed with a pattern as shown in FIG. 3 in the direction of the main plane. When the dimensional dispersion of the ceramic substrate is large, the dimensional dispersion of the electrode pattern also becomes large. Due to such dispersion in thickness of the substrate or electrode pattern, unevenness of the adhesion performance on chucking (i.e., chucking adhesion power) is formed in the main plane. Therefore, when using sheets prepared by the doctor blade method, the outer diameter that is stably produced is 100 mm at most. Accordingly, when it is applied to one having a large diameter having an outer diameter exceeding 100 mm, which is being demanded particularly in recent years, the yield of products is poor, and the mass productivity is poor. In order to improve this, the latter method, in which the proportion of the volatile component during firing is relatively small, is advantageous as compared with the former method.

On the other hand, the latter method is a method in which material powders are molded under pressure after being filled in a mold (dry molding) or molded by extruding a kneaded article thereof, followed by sintering. In this method, sintering procedures of the ceramics main body and the high melting point metallic layer are conducted separately, and a product having a relatively large thickness can be molded. Accordingly, the problems in the former can be relatively easily avoided. When polish finishing of both the main planes after sintering, straightening at a high temperature and simultaneous sintering bonding on application of heat and pressure are conducted, substantially no deformation occurs on the subsequent firing of the high melting point metallic layer. Therefore, a product having higher dimensional precision than the former method can be sufficiently obtained.

However, since aluminum nitride ceramics is difficult to be sintered when its constitutional component is only AlN, generally a sintering aid containing a Group 2a element (Be Mg, Ca, Sr, Ba and Ra) or a Group 3a element (Y, Sc, lanthanum series elements and actinium series elements) is added to aluminum nitride and sintering is conducted at a high temperature of 1,600° C. or more under a liquid phase of the sintering aid. While these sintering aids generally become vitreous materials, these vitreous materials are liable to be decomposed by the above-mentioned high temperature plasma containing fluorine. The reaction product formed by decomposition of the vitreous materials is volatilized and dispersed into the high temperature medium to become dusts, and is released from the susceptor to remain as a hole. This lowers the corrosion resistance of the susceptor and shortens the life of the susceptor itself. Further, dusts are newly generated from the part of the holes and cause contamination of wafers. It is therefore preferred that the amount of the sintering aid to be added be small. However, when the addition amount of the sintering aid is too small, the sintering becomes difficult to cause a problem in that a dense product cannot be obtained.

Japanese Patent Publication No. 63435/1993 discloses aluminum nitride ceramics in which a Group 3a element as a sintering aid is uniformly dispersed in a small amount and contains a small amount of a vitreous phase. In column 7, lines 26 to 34 of the publication, there is suggested that because the aluminum nitride ceramics contains a small amount of a vitreous phase composed of the sintering aid, it is relatively suitable as the usage aimed in the invention.

SUMMARY OF THE INVENTION

The inventors have continued studies and investigations based on the material described in the above publication to provide an electrostatic chuck that could be stably produced with maintaining the above-mentioned dimensional precision and practical performance. As a result, an electrostatic chuck of high quality that has not been obtained conventionally could be obtained by modifying or specifying the composition and the method for molding and sintering while controlling the AlN crystal particle size or the amount of defects of the aluminum nitride ceramics so as to ensure a high dimensional precision.

Accordingly, the electrostatic chuck that the invention provides is (1) a susceptor for semiconductor manufacturing equipment formed by laminating plural substrates comprising an aluminum nitride ceramic with a high melting point metallic layer and an adhesive layer. In the electrostatic chuck of the invention, (2) it is preferred that the aluminum nitride ceramic comprises a compound of a Group 3a element in an amount of from 0.01 to 1% by weight in terms of the element, and the average particle size of an AlN crystal is from 2 to 5 $\mu$m. It is preferred that (3) the thermal conductivity of the aluminum nitride ceramic is 150 W/m·K or more.

Further, the invention includes (4) a susceptor in which the uppermost substrate of the laminated substrates comprises a ceramic other than aluminum nitride ceramic and (5) a susceptor in which the uppermost substrate of the laminated substrates is coated with a diamond layer. Furthermore, the invention includes (6) a susceptor in which the substrate has 5 or less of pores having a maximum diameter exceeding 1 μm at a triple point of grain boundaries in an arbitrary rupture section of 1,000 μm$^2$ and (7) a susceptor in which the high melting point metallic layer comprises at least one element selected from the group consisting of W, Mo and Ta, and in which the same layer comprises low melting point glass. is preferred that (8) the low melting point glass is an oxide glass comprising at least one element selected from the group consisting of Ca, Al and Si, and the invention involves (9) a susceptor in which the adhesive layer comprises 80% by weight or more of aluminum nitride (AlN) and the balance consisting essentially of a compound of an element of Group 2a and an element of Group 3a of the periodic table.

The production process of an electrostatic chuck provided by the present invention is as follows: That is, the invention provides (1) a process comprising a step of forming a mixture by adding a powder of a sintering aid to a powder of aluminum nitride and mixing these powders (step 1); a step of forming a molded body by molding the mixture (step 2); a step of forming a sintered body by firing the molded body in a non-oxidizing atmosphere at a temperature range of from 1,600 to 2,000° C. (step 3); a step of forming a substrate by working the sintered body into a desired shape (step 4); a step of preparing a plurality of the substrates, and a material forming a high melting point metallic layer and a material forming an adhesive layer as insertion materials (step 5); a step of forming an assembly by laminating the substrates with sandwiching the insertion materials (step 6); a step of firing the assembly into a laminate in a non-oxidizing atmosphere at a temperature range of from 1,500 to 1,700° C. (step 7); and a step of finishing the laminate (step 8).

The present invention includes (2) a process in which in the step 1, a powder of a compound containing at least one element selected from elements of Group 3a of the periodic table in an amount of from 0.01 to 1% by weight in terms of the element is added and mixed as the sintering aid; (3) a process in which in the step 3, the molded body is fired in a non-oxidizing atmosphere at a temperature range of from 1,600 to 2,000° C., and then cooled to 1,500° C. at a cooling rage of 200° C. per hour or more to form a sintered body; (4) a process in which in the step 5, a ceramic other than an aluminum nitride ceramic is provided as the uppermost one of the substrates to be laminated; and (5) a process in which the step 8 includes forming a diamond layer onto the uppermost substrate of the laminated substrates.

DETAILED DESCRIPTION OF THE PREFERRED EMBODIMENTS

Figure 2A:
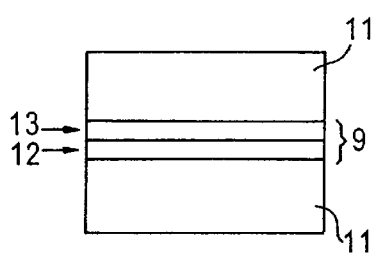
FIGS. 2A–2C are diagrams schematically showing the laminated structures of the susceptors for semiconductor manufacturing equipment according to the invention.
Figure 2B:
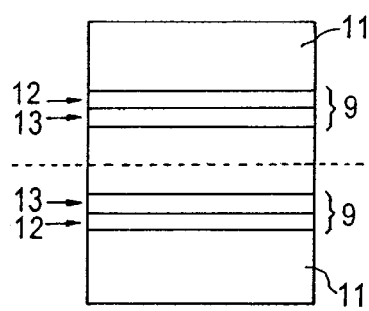
Figure 2C:
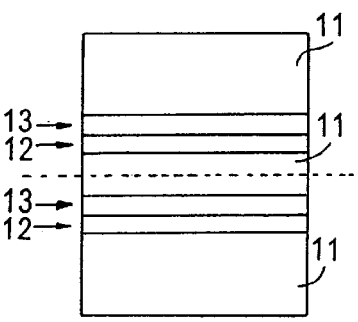

The electrostatic chuck provided by the invention is a susceptor for semiconductor manufacturing equipment, which is formed by laminating the plural aluminum nitride ceramic substrates with the high melting point metallic layer and the adhesive layer as described above. An electrostatic chuck having a representative lamination structure according to the invention is schematically shown in FIGS. 2A–2C. In the figures, numeral 11 denotes a ceramic substrate, and 9 denotes an insertion layer, in which 12 denotes a high melting point metallic layer (thick film electrode) for generation of static charge, and 13 denotes an adhesive layer provided for adhering the electrode melting point metallic layer and the substrate. FIG. 2A is the case where the number of the lamination substrate layers is 2, and FIGS. 2B and 2C are the cases where the number of the lamination substrate layers is 3. In the case of 2-sheet lamination, the order of the two layers in the insertion layer is the high melting point metallic layer and the adhesive layer, from the side of the lower substrate. In the case where 3 sheets of FIG. 2B, the adhesive layer and the high melting point metallic layer are arranged in this order in the insertion layer from the central substrate to the upper side and the lower side. That is, in the case of FIG. 2B, the arrangement is symmetrical with respect to the auxiliary line represented by the broken line. In the case of FIG. 2C, the high melting point metallic layer and the adhesive layer are arranged in this order in the insertion layer from the central substrate to the upper side, and the adhesive layer and the high melting point metallic layer are arranged in this order in the insertion layer from the central substrate to the lower side. That is, in the case of FIG. 2C, the arrangement is unsymmetrical with respect to the auxiliary line represented by the broken line. The arrangement of the insertion layer of FIG. 2c can be understood as viewed from the lower side that the arrangement of the insertion layer in FIG. 2A is laminated. In the case where 2 sheets of the substrates are laminated, the electrostatic chuck of the invention has the lamination constitution in FIG. 2A, and in the case where the 3 or more sheets of the substrates are laminated, it has the lamination constitution 2B or 2C when an arbitrary lamination unit containing 3 substrates is extracted.

In the structure described above, in which plural substrates are laminated, while aluminum nitride ceramics are generally employed as all the ceramic substrates, the uppermost ceramic substrate may comprise ceramics other than aluminum nitride ceramics depending on the film formation condition of the semiconductor wafer and the cleaning condition of the interior of the chamber on practical use. In this case, it is preferred to use ceramics having a relatively high thermal conductivity and electric insulation property, such as alumina series ceramics (ceramics comprising $Al_2O_3$ as the main component), boron nitride series ceramics (ceramics comprising BN as the main component). As the ceramic substrate used in the electrostatic chuck of the invention, those described above are materials involving no problem from the standpoint of corrosion resistance. However, when a very high corrosion resistance is required, it is preferred to use one containing AlN in an amount of 99% by weight or more. By using such aluminum nitride ceramics having a high AlN purity as the substrate, the damage on the surface of the substrate and wearing of the substrate in a plasma atmosphere containing fluorine are lowered. When the amount of AlN becomes smaller than 99% by weight, the amount of the grain boundary phase, which is poor in corrosion resistance, becomes relatively large in the substrate, and there is a tendency that the damage on the surface of the substrate and wearing of the substrate on practical use are increased.

It is preferred that the component of the grain boundary phase of the substrate is constituted by one containing at least one of Group 3a elements. This is because, for example, an oxide of yttrium (Y) is excellent in corrosion resistance to the plasma described above. The volume of the grain boundary phase is preferably 0.9% by volume or less of the sintered body. The measurement of the volume percentage in this case is conducted in such a manner that an arbitrary ruptured or polished plane of the ceramic substrate is observed by a scanning electron microscope, and surface analysis of the element constituting the grain boundary phase on the two-dimensional projected image. More specifically, the intensity of the characteristic curve of the same component element in the surface is measured and the obtained result is converted to a volume percentage by using a calibration curve produced by using a sample, the volume percentage of the same element of which has been known. Cations other than those of Group 3a elements in the sintered body become a factor of generation of dust, and thus it is preferably 0.5% by weight or less (value obtained by spectral analysis).

As the AlN crystal particles in the sintered body, those having an average particle size of from 2 to 5 μm are preferred, and those having an average particle size smaller than 5 μm are more preferred. Its thermal conductivity is preferably 150 W/m·K or more. When the average particle size is less than 2 μm, the relative volume of the grain boundary phase is increased, and there is possibility that the corrosion resistance to the plasma described above becomes poor. When the average particle size exceeds 5 μm, defects present in the triple point of the grain boundary of the ceramics (mainly pores) become large, and there is possibility that the plasma corrosion resistance becomes poor. Its thermal conductivity is preferably as high as possible to exhibit rapid thermal conduction function of the electrostatic chuck. Particularly, in the case where the substrates are laminated to form a multi-layer structure, because the electrostatic chuck contains the high melting point metallic layer and the adhesive layer as the insertion layers, which have lower thermal conductivity than the substrate, the thermal conductivity of the substrate is preferably 150 W/m·K or more.

Moreover, the ceramic substrate is preferably a dense product having a relative density (ratio of a density measure by the submerge method to the theoretical density) of 99.5% close to the theoretical density. When pores are present in the substrate, its surroundings are liable to be corroded by plasma, and a defect, in which impurities are deposited (which is called a crater hereinafter), is liable to be formed. Further, when the frequency of the presence of pores in the substrate is high, the frequency of generation of defects such as crater after exposure to plasma becomes high, and as a result, contamination of the surface of the semiconductor wafer will become further serious. According to the generation of the defects, the impurities deposited in the defects are scattered as dusts, which phenomenon accelerates removal of AlN particles around the defect parts. Thus, the extent of contamination of a wafer is increased by increasing the number of sheets to lower its production yield, and at the same time, the life of the electrostatic chuck is also lowered. As a-result of investigation of the above substrate composition, the inventors have confirmed that there is proportionality between the frequency of presence of pores per unit area of the substrate before exposure to plasma and that after exposure to plasma. It has also been confirmed that it is important to suppress the size of individual pores.

The present inventors have found that it is desirable to suppress pores having a maximum diameter exceeding 1 μm present at a triple point of grain boundaries in an arbitrary rupture section of 1,000 μm² to 5 or less. In this case, language "a maximum diameter exceeding 1 μm" means that when a circle of 1 μm is so arranged 6n the pore that their centers substantially agree with each other, at least a part of outer circumference of the pore sticks out from the outer circumference of the circle. The measurement of the size and number of the pores is conducted by using a two-dimensional projected image (photograph) obtained by observing an arbitrary rupture section of the ceramic substrate by a scanning electron microscope. The measurement of the size and number of craters after use is conducted by using a two-dimensional projected image (photograph) obtained by observing an arbitrary exposed surface of the ceramic substrate by a scanning electron microscope, as substantially the same as above. By using the substrate, in which the pore density (frequency of presence of pores) is controlled, as described above, the frequency of generation of the above-described secondary defects formed by corrosion can be considerably suppressed.

In the electrostatic chuck of the invention, when a plurality of the high melting point metallic layers are inserted, one of them is used as an electrode applying an electric field to the chuck. All the high melting point metallic layers exhibit the function of relaxing thermal stress on installation and practical use to ensure the bonding strength. The thickness of the insertion layer is preferably from 1 to 100 μm. When it is less than 1 μm, a gap is liable to be formed at the bonding interface, and there is a case where the bonding strength is lowered. When it exceeds 100 μm, the proportion of the layer containing the vitreous component, which has mechanical strength and thermal conductivity lower than the substrate material, is increased. Accordingly, there is a case where the bonding strength is lowered, and the thermal conductivity in the direction of thickness of the electrostatic chuck is lowered.

The high melting point metallic layer preferably contains at least one element selected from the group consisting of W, Mo and Ta. These elements are present in the same layer as a metal or an alloy, and the total amount of them in the same layer is preferably 50% by weight or more. The most preferred method for forming the high melting point metallic layer is that a conductive paste containing a high melting point metal is coated by printing and fired. The film formation can be conducted by other methods including a method, in which a foil containing the metal is placed on the substrate, followed by adhered with pressure, and when a thin layer is sufficient, the conventional film formation method such as vapor deposition, in which a thin film of the metal is formed on the ceramics. When the procedure, in which these components are coated onto the substrate by printing, followed by firing, is conducted, low melting point glass is added to the conductive paste to accelerate sintering of the particles of the high melting point metal in the layer and simultaneously to ensure the bonding strength between the layer and the substrate.

Especially, in the case of the substrate having a large AlN amount therein, the low melting point glass is used to enhance the wettability with AlN in the substrate and to accelerate sintering of the particles of the high melting point metal so that the bonding strength between the laminated substrates is enhanced. For this, oxide glasses containing at least one element selected from the group consisting of Ca, Al and Si are preferred and among these glasses an oxide glass having a composition comprising Ca, Al and Si in amounts of from 5 to 30% by weight, from 20 to 60% by weight and from 20 to 60% by weight, respectively, as converted to their oxides, CaO, $Al_2O_3$ and $SiO_2$, is more preferably used. Also, in the case where the uppermost substrate layer is constituted by ceramics other than aluminum nitride ceramics, the above-described species can be substantially applied as the low melting point glass layer.

As the adhesive layer, a material that exhibits good adhesion to the high melting point metal and the substrate and provides a high bonding strength with them (hereinafter sometimes called "peeling strength") is selected. Specifically, it is preferable that either one a material comprising aluminum nitride as the main component and having a melting point lower than the substrate or a material comprising as the main component the same oxide glass as the low melting point glass included in the high melting point metallic layer is selected. More preferably, in both cases of the former and latter materials, the lower melting point glass is an oxide glass including at least one selected from the group consisting of Ca, Al and Si. In the former case, it is particularly preferred to comprise 80% by weight or more of aluminum nitride and the balance consisting essentially of compounds of an element of Group 2a and an element of Group 3a of the periodic table. In the case where the high melting point metallic layer contains the above-described oxide glass phase, by using the adhesive layer having such a composition, the wettability to the same layer is considerably improved, and the thermal conductivity of the adhesive layer itself can be relatively high. In the latter case, since the adhesive layer exhibits a good adhesion to both the substrate surface and the high melting point metallic layer, a further enhanced bonding strength can be obtained. Further, since the adhesive layer contains no aluminum nitride, the cost can be reduced. In the former case, when the adhesive strength is regard as important rather than thermal conductivity, it is possible that AlN is not added to the adhesive layer, or its amount in the adhesive layer is less than 80% by weight. When the substrates are bonded with only the high melting point metallic layer without the adhesive layer as the insertion layer, the bonding strength is insufficient since the metallic elements in the high melting point metallic layer do not contribute to adhesion, and a problem may arise, such as peeling on use as an electrostatic chuck.

Moreover, a diamond layer may be formed on the wafer-mounting face of the uppermost one of the laminated substrates. Since diamond has a high thermal conductivity (about 1,000 W/m·K), the diamond layer improves heat transfer to a wafer and the surface temperature of the wafer is further rapidly heated uniformly. Accordingly, an insulating layer can be formed on the wafer with a uniform composition and an even thickness. The thickness of the diamond layer is 100 $\mu$m or less.

Figure 3:
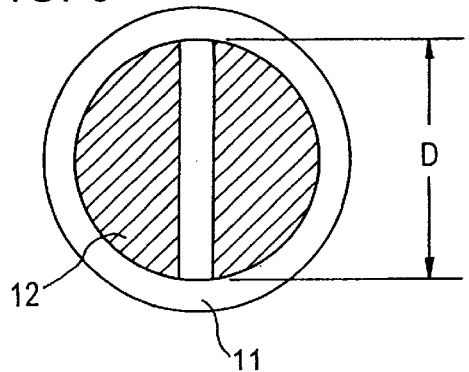
FIG. 3 is a diagram showing an example of the formation pattern of the high melting point metallic layer on the susceptor of the invention.

The warp in the direction of the main plain of the susceptor according to the present invention is 0.3 $\mu$m/mm or less. Further, the dispersion width of outer dimensions (for example, the outer diameter D, the width of a slit part, etc., of a pattern shown in FIG. 3) of a pattern of the high melting point metallic layer is 1% or less. Therefore, when an insulating film is formed on a wafer, the film formation can be effected with an even thickness and a high dimensional precision while ensuring a stable electrostatic chucking function.

The process for producing an electrostatic chuck according to the invention is as described above. First, in the step 1, as the raw material powder of aluminum nitride used, one having an average particle size of 1 $\mu$m or less, an oxygen content of 2% by weight or less and a cation impurity content of 0.5% by weight or less is preferably used. By using such fine and uniform raw material powder, fine particles of powder containing a Group 3a element are uniformly dispersed on their surface by mixing, and thus a sintered body having a uniform average particle size and uniform composition can be obtained after sintering. Thus, a substrate suitable for the electrostatic chuck can be easily obtained.

As the sintering aid used, powder of a compound of Group 3a element is preferable. The average particle size of the powder is preferably 1 $\mu$m or less, and more preferably 0.5 $\mu$m or less. In order to uniformly finely dispersed the particles of the sintering aid on the surface of the particles of the AlN powder as the main raw material, it is preferred to use organic salts of these elements. For example, a stearate, a palmitate and various alkoxides may appropriately be used as the organic salt. However, other organic salts can be used as long as they are converted into metal oxides through thermal decomposition by firing. It is the most preferred to add in the form of a stearate among these. These components are preferably added in an amount range of from 0.01 to 1% by weight in terms of amounts converted to the Group 3a element. The mixed powders may further be added with small amounts of an organic binder component such as paraffins, PVB (polyvinyl butyral) and PEG (polyethylene glycol) as a molding assistant. In order to prevent solid dissolution of oxygen into the AlN crystals in advance and to thereby obtain a sintered body having high thermal conductivity, a small amount of a carbon source may be added for removing oxygen (deoxidizing) on the surface of the raw material powder when firing. Such a carbon source includes graphite, a phenol resin, etc. As a medium used on mixing, in order to avoid mixing of a cation impurity other than the metal as the main component, in general, an organic material such as nylon, which is volatile on firing, and a material similar to the substrate material such as aluminum nitride are preferably used. As a mixing solvent, an organic solvent is generally used to suppress decomposition of the AlN powder. According to the above-described selection of the raw materials and the mixing conditions, mixed powders, in which an extremely thin film containing a Group 3a element is uniformly and finely formed on the surface of the particles of the AlN powder, are obtained.

Various methods can be applied to the step 2 of the invention. However, the dry powder molding method and the extrusion molding method, in which the amount of the molding binder is small, is preferred to make the shrinkage on sintering small and to make possible the attainment of a molded body having a relatively large thickness, in comparison to the doctor blade method forming a molded body in the form of a thin plate and the injection molding method, in which the amount of the binder is large. Particularly, the dry isostatic pressing is the most preferred molding method since the density distribution within the molded body can be suppressed, and as a result, the molded body relatively uniformly shrinks on sintering. In the case where the molding method is such a dry powder molding method, it is desirable from the viewpoint of enhancing the moldability that the mixed powder is formed into a granule form that has high packing flowability and high packing bulk density by granulation. While the granulation may be conducted by using the various conventional granulation methods. In order to increase the bulk density of the granulated powder, it is preferred to prepare two kinds of granulated powders, in which the particle size ratio of coarse particles to fine particles is in the range of from 2/1 to 3/1. The thus obtained powders are mixed in a ratio by weight of the coarse particles to the fine particles of about from 3/1 to 5/1. Alternatively, granulated powder having such two kinds of average particle sizes may be prepared. For example, from 15 to 25% by weight of granulated powder having an average particle size of from 50 to 100 μm and from 75 to 85% by weight of granulated powder having an average particle size of from 130 to 300 μm are mixed. By combining such granulation method and isostatic pressing, a molded body having an apparent density on powder molding that is 60% or more with respect to the theoretical density of the sintered body can be easily obtained, and the shrinkage percentage on sintering and its dispersion within the molded body can be suppressed to relatively small values.

While depending on the shape of the molded bodying, when a molded body is formed by a dry molding method using granulated powder having unsuitable granulated particle size constitution or using non-granulated powder, or by a wet molding method, the shrinkage percentage on its sintering is generally about 20%, and its dispersion within the molded body is about 1%. On the other hand, in the case where isostatic pressing is conducted by using the above-mentioned granulated powder, the shrinkage percentage of the molded body can be suppressed to 17% or less, and its dispersion with the molded bodies is suppressed to 0.7% or less. Depending on the molded shape, the shrinkage percentage can be suppressed to about 15% or less. In the case where the molding is conducted by the extrusion molding, it is preferred that the amounts of the binder and the solvent are reduced as possible to decrease the amount of the volatile component on heating, and deaeration on kneading is sufficiently conducted, so that the factors forming voids during sintering the molded body are suppressed as possible. By selecting the suitable molding method to suppress the dispersion of the shrinkage percentage within the molded body to a small value, the deformation amount on sintering is suppressed, and the cost for finish working after sintering can be reduced. Therefore, it is suitable means for manufacture of a substrate having a large diameter and a small thickness aimed by the invention.

In the step 3, the molded body thus obtained is heated in a non-oxidizing atmosphere, generally in an atmosphere containing nitrogen, at a temperature range of from 1,600 to 2,000° C. Sintering temperature and time vary depending on the characteristics of the raw material powders, the production conditions before sintering, the total amount of the sintering aids, etc. By sintering at the temperature within this range, a dense sintered body having an average particle size of from 2 to 5 μm, generally less than 5 μm, can be surely obtained. Preferably, it is cooled in the subsequent cooling step to 1,500° C. at a cooling rate of not lower than 200° C. per hour. By employing the cooling step, the component of the grain boundary becomes uniform within the sintered body to make the grain boundary phase uniform, and a substrate having more uniform quality, excellent corrosion resistance and a long life can be obtained. In general, the sintering atmosphere is preferably an atmosphere containing nitrogen. When the sintering temperature is less than 1,600° C., the sintering becomes insufficient, and the objective dense sintered body cannot be obtained. When the sintering temperature exceeds 2,000° C., the average particle size exceeds 5 μm, and in the case of a thin article, deformation is liable to be occur.

In the step 4, the sintered body is subjected to finish working to make a substrate. The electrostatic chuck is required to be excellent in smoothness of the uppermost main plane, by which a semiconductor material is retained, and in parallel property and flatness between that plane and the lowermost main plane. In particular, the sintered body having a large diameter, for example that having a size of a diameter exceeding 100 mm, is generally difficult to have the above-described properties within the level demanded if it is in a condition immediately after sintering. Therefore, a margin for working in the step 4 must be expected in the preceding step.

In the step 5, plural substrates having been subjected to finish working, and, as an insertion material, a material for forming the high melting point metallic layer and a material for forming the adhesive layer are prepared. As the material for forming the high melting point metallic layer, a conductive paste containing the above-described high melting point metal is preferably used. Into the paste, the above-described low melting point glass and the conventional organic substance for adjusting viscosity are contained. In this case, the conductive paste is printed and coated in a desired pattern on the surface of one substrate, to which another substrate is adhered through the layer. Thus, a precursor of the layer is formed. The method for applying the precursor of the high melting point metallic layer include, other than the method of coating by printing, a method in which a material, such as a metallic foil containing the high melting point metal, is arranged, and a method in which the same component is arranged by means including vapor deposition and dip coating. As the material for forming the adhesive layer, the above-described materials is used to obtain high bonding strength between the high melting point metallic layer and the substrate. With respect to the method for application, various methods including a method in which a paste composed mainly of the above-described materials is coated by printing are applied. It is preferred that the material of the insertion layer is those capable of making the insertion layer itself being excellent as possible in thermal conductivity and corrosion resistance. From this point of view, one comprising tungsten (W) as the main component is preferred for the high melting point metallic layer, and one comprising composed of the above-described AlN as the main component is preferred for the adhesive layer. The invention involves a method in which after firing the high melting point metallic layer on one substrate by the post-metallizing method, a precursor of the adhesive layer is arranged thereon, followed by firing, and then conducting assembly in the step 6, or after firing the high melting point metallic layer onto the substrate by the post-metallizing method, and then conducting assembly. According to these procedures, adverse effects to the pattern of the high melting point metallic layer due to the formation of the adhesive layer. For example, blurring with a paste of the high melting point metallic layer can be prevented from occurring.

As described in the foregoing, several means can be considered for the application method of the insertion layer in the assembly step 6 and the firing step 7 of the invention. Particularly, in this case, after a precursor of the high melting point metallic layer is applied on the surface of one substrate as in the fixed condition (or arranged in a non-fixed condition), and a precursor of the adhesive layer is applied on the surface of the other substrate facing the former substrate in the fixed condition (or arranged in a non-fixed condition), these surfaces are adhered to laminate the substrates, and a laminated body to which the respective layers are inserted is produced by firing (method 1). Alternatively, after a precursor of the insertion layer composed of the two layers is applied to the surface of one substrate in a fixed condition (or arranged in a non-fixed condition), the surface of the substrate and the surface of the other substrate, on which the precursor of the insertion layer is not applied (or arranged) are adhered to laminate the substrates, and a laminated body to which the respective layers are inserted is produced by firing (method 2). Any of these methods 1 or 2 may be conducted. With respect to the firing condition for the layer comprising the precursor applied, it is conducted in a non-oxidizing atmosphere (generally in a nitrogen atmosphere) at a temperature range of from 1,500 to 1,700° C. In the case where precursor layers of the individual layers of the insertion layer are previously applied to the substrate by means, such as vapor deposition, followed by firing, the substantially same procedures as above may be conducted. In the case where a solid matter such as a metallic foil and powder is used as a material for the insertion layer, procedures may be employed, in which an assembly comprising the substrates between which the materials are inserted without applying the precursors is fired or fired with pressure to laminate and unite plural substrates at once. The firing conditions in this case may follow the above.

When the individual substrates before laminating has an outer diameter of 100 mm or less, and the warp and deformation amount on sintering is relatively small, it can be produced by the co-firing method described above. That is, a substrate molded body corresponding to this substrate size is formed in the step 2, a conductive paste containing the high melting point metal is directly coated to this. A material for forming the adhesive layer is further inserted to arrange according to the desired order of lamination, the high melting point metallic layer and the ceramic substrates are simultaneously sintered in the step 3, to produce a material of the electrostatic chuck contemplated by the invention, in which plural substrates are laminated, at low cost.

In the electrostatic chuck of the invention, electrically insulating ceramics other than aluminum nitride ceramics are used as the uppermost substrate as described above. Preferred ceramics include, for example, those having relatively high thermal conductivity, such as alumina series ceramics (mainly composed of $Al_2O_3$) and boron nitride series ceramics (mainly composed of BN). In the case where these ceramics are employed, the lower layers of the substrates are preferably constituted by aluminum nitride ceramics to ensure the sufficient thermal conductivity of the whole body of the electrostatic chuck. With respect to the constitution of the insertion layer (the high melting point metallic layer and the adhesive layer) used in lamination of the substrates, the above-described constitution may basically applied. Depending on the composition of the substrate, after producing a lower part comprising substrates of aluminum nitride ceramic laminated, the above other ceramic substrate separately sintered may be bonded as the uppermost part with inserting the above-described insertion layer. Alternatively, ceramic substrates of the lower layer to the uppermost layer are individually sintered separately, a laminated body to which the insertion layer is inserted is produced by firing at once.

Figure 1:
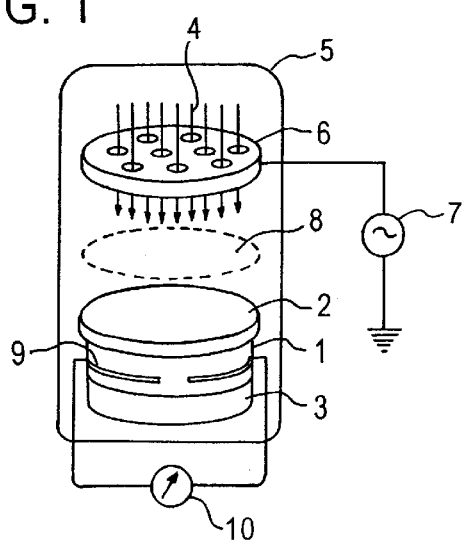
FIG. 1 is a diagram schematically showing a semiconductor film formation apparatus of the electrostatic chucking type according to the invention.

The electrostatic chuck according to the invention can be produced as united with the heater provided at its lower part (see FIG. 1). For example, depending on the material of the heater, it is possible that a material for the heating part formed in the form of a line pattern or a plate pattern is inserted. As another method, onto a layer of the heating part which has previously been formed on the ceramic substrate, another ceramic substrate is placed so that the heater can be embedded and fixed simultaneously with firing the ceramic matrix. Because the ceramic to be the matrix of the heater is required to have high thermal conductivity, the matrix is preferably can be constituted with aluminum nitride ceramics.

The laminate is finished to the finally desired size in the step 8. The laminate of this present invention has a small warp as compared with conventional ones. Accordingly, the margin for the finishing treatment can be reduced and the trouble for working can be omitted. As mentioned above, in some case a diamond layer is formed onto the uppermost layer of the substrate and the layer is usually formed by vapor phase film formation processes such as heater filament CVD, microwave plasma CVD, direct plasma CVD, etc.

EXAMPLE 1

AlN powder having an average particle size of 0.8 $\mu$m, an oxygen content of 1% by weight and a cation impurity content of not greater 0.3% by weight; as a sintering aid, yttrium oxide powder and yttrium stearate powder having an average particle size of 0.3 $\mu$m; and as an organic binder, PVB were prepared. The AlN powder and the sintering aid powder were weighed in such a manner that the amount of the sintering aid became the parts by weight in terms of Y element as shown in Table 1, and the balance part by weight was AlN. As the organic binder, 3% by weight of PVB based on the total (100% by weight) of them was weighed. Thereafter, they were mixed with a ball mill for 12 hours in an alumina pot by using nylon balls in an ethyl alcohol solvent. The resulting slurry was spray dried to be granulated into a granule condition of substantially spherical shape, in which the proportion of the particles having an average particle size of 80 $\mu$m was about 20% by weight, and the proportion of the particles having an average particle size of 200 $\mu$m was about 80% by weight (granulated powder 1). Separately, the slurry was spray dried to be granulated into a granule condition of substantially spherical shape that comprised granules having an average particle size of 100 $\mu$m (granulated powder 2). These powders were filled in a rubber mold with vibration and subjected to isostatic pressing at a pressure of 2 tons/cm$^2$, so as to mold into a shape having a diameter of 300 mm and a thickness of 7 mm (molding method 1). With respect to the granulated powder 2, a part thereof was molded by a dry press method with a pressure of 1 ton/cm$^2$ (molding method 2). A molded body that was produced by molding the granulated powder 1 by the molding method 1 had a bulk density of about 63% of the theoretical density of a sintered body; a molded body that was produced by molding the granulated powder 2 by the molding method 1 had a bulk density of about 55% of the theoretical density; and a molded body that was produced by molding the granulated powder 2 by the molding method 2 had a bulk density of about 50% of the theoretical density. The bulk density herein was obtained by dividing the weight of the molded body by its volume to obtain the apparent density and then dividing the apparent density by the theoretical density of the same molded body composition (the density value of the same composition that is completely densified).

After removal of the PVB, the resulting molded body was maintained in an atmosphere of a nitrogen gas stream at the temperature and time shown in Table 1, was cooled to a temperature of 1,500° C. at a rate shown in Table 1, and then allowed to be cooled to room temperature, so as to obtain a sample of a sintered body. The shrinkage percentage on sintering of the molded body of the granulated powder 1 was about 16% in both the direction of diameter and the direction of thickness, and that of the molded body of the granulated powder 2 was about 20%. The samples attached to "-" in the column of cooling rate in Table 1 were not cooled to a temperature of 1,500° C. at a constant cooling rate, but was spontaneously cooled in a furnace from the sintering temperature to room temperature. A part of the resulting sintered bodies was cut out as a test sample for measuring thermal conductivity, etc., and, as shown in Table 1, was measured for relative density (a percentage of the density measured by the submerge method to the theoretical density of the respective sample composition), thermal conductivity (calculated from the thermal diffusion rate obtained by the laser flash method), defect density (in a two-dimensional projected photograph obtained by observation of a polished surface by a scanning electron microscope, the number of pores having a maximum diameter exceeding 1 μm present at the grain boundary triple point within a view field corresponding to 1,000 μm² was counted), Y amount (spectral analytical value of the sintered body), and the average particle size of the AlN crystal particles (in a two-dimensional projected photograph obtained by observation of a ruptured surface by a scanning electron microscope, the arithmetic mean of all the particle sizes cut by the two diagonal lines being calculated in trial as the average particle size). In Sample Nos. 1 to 17 in Table 1, the Y component was added in the form of yttrium stearate on mixing the raw materials, and it was molded in the condition of the granulated powder 1 by the above-mentioned molding method 1; in Sample Nos. 18 to 20, the Y component was added in the form of yttrium oxide on mixing the raw materials, and it was molded in the condition of the granulated powder 1 by the above-mentioned molding method 1; in Sample Nos. 21 to 23, the Y component was added in the form of yttrium stearate on mixing the raw materials, and it was molded in the condition of the granulated powder 2 by the above-mentioned molding method 1; and in Sample Nos. 24 to 26, the Y component was added in the form of yttrium stearate on mixing the raw materials, and it was molded in the condition of the granulated powder 2 by the above-mentioned molding method 2.

When the above-described disk shaped sintered samples were measured for surface roughness(Rmax) of the main plane and warp in the direction of the diameter of the main plane without polish working, Sample Nos. 1 to 20, which were molded by using the granulated powder 1 by the molding method 1, had those values falling within the ranges of 5 μm or less and 5 μm/mm or less, respectively. Samples Nos. 21 to 23, which were molded by using the granulated powder 2 by the molding method 1, and Samples Nos. 24 to 26, which were molded by using the granulated powder 2 by the molding method 2 had a surface roughness (Rmax) of the main plane falling within the range of 5 μm or less, but their warp in the direction of the diameter of the main plain was 7 μm/mm or more. Particularly, those molded by using the granulated powder 2 by the molding method 2 exhibited a warp of 10 μm/mm or more. The samples including samples of Comparative Examples were subjected to finish working to have a thickness of the sample of 2.0±0.05 mm, and a diameter of 200 mm±0.5 mm, and the flatness in the direction of main plane and the surface roughness (Rmax) were about 0.07 mm and about 1 μm, respectively.

Separately, $Al_2O_3$ powder having an average particle size of 1 μm and a cation impurity content of not greater than 0.4% by weight; as a sintering aid, magnesium palmitate powder, magnesium stearate powder, silicon oxide ($SiO_2$) powder, and calcium carbonate ($CaCO_3$) powder; and as a binder, PVB were prepared. The $Al_2O_3$ powder and the magnesium palmitate powder were weighed in an amount of 3 parts by weight in terms of Mg element for the magnesium palmitate, and the balance composed of $Al_2O_3$ (Sample No. 27). The $Al_2O_3$ powder, the magnesium stearate powder, the $SiO_2$ powder and the $CaCO_3$ powder were weighed in an amount of 3 parts by weight in terms of Mg element for the magnesium stearate, in an amount of 2 parts by weight in terms of Si for the $SiO_2$, in an amount of 2 parts by weight in terms of CaO for the $CaCO_3$, and the balance parts by weight being $Al_2O_3$ (Sample No. 28). Furthermore, as an organic binder, 3% by weight of PBV was weighed based on the total (100% by weight) of them. Thereafter, they were mixed in a ball mill, as similar to the case of AlN, and the

TABLE 1

| No. | Addition amount of sintering aid (wt % in terms of Y) | Sintering condition Temperature (° C.) | Time (hour) | Cooling rate (° C./hr) | Relative density (%) | Thermal conductivity (W/m · K) | Defect density | Y amount (wt %) | AlN average diameter (μm) |
|---|---|---|---|---|---|---|---|---|---|
| *1 | 0.005 | 1,850 | 4 | 250 | 88 | 50 | 20 | 0.005 | 1.8 |
| *2 | 0.005 | 1,850 | 6 | 250 | 92 | 60 | 17 | 0.005 | 1.9 |
| 3 | 0.01 | 1,850 | 5 | 250 | 99.5 | 160 | 5 | 0.01 | 3.2 |
| 4 | 0.2 | 1,850 | 5 | 250 | 100 | 200 | 5 | 0.2 | 3.3 |
| 5 | 0.8 | 1,850 | 5 | 250 | 100 | 240 | 3 | 0.8 | 4.0 |
| 6 | 1.0 | 1,850 | 5 | 250 | 100 | 240 | 4 | 1.0 | 4.8 |
| *7 | 1.3 | 1,850 | 5 | 250 | 99 | 240 | 10 | 1.3 | 5.7 |
| *8 | 1.3 | 1,850 | 6 | 250 | 99 | 240 | 12 | 1.3 | 6.4 |
| *9 | 0.8 | 1,580 | 6 | 250 | 94 | 80 | 15 | 0.8 | 1.6 |
| 10 | 0.8 | 1,600 | 6 | 250 | 99.5 | 180 | 5 | 0.8 | 3.0 |
| 11 | 0.8 | 1,700 | 6 | 250 | 100 | 230 | 5 | 0.8 | 4.1 |
| 12 | 0.8 | 2,000 | 6 | 250 | 100 | 240 | 5 | 0.8 | 4.5 |
| *13 | 0.8 | 2,030 | 6 | 250 | 97 | 220 | 8 | 0.8 | 6.9 |
| 14 | 0.8 | 1,850 | 5 | 180 | 100 | 240 | 3 | 0.8 | 4.1 |
| 15 | 0.8 | 1,850 | 5 | 200 | 100 | 240 | 3 | 0.8 | 4.1 |
| 16 | 0.8 | 1,850 | 5 | 300 | 100 | 240 | 3 | 0.8 | 4.1 |
| 17 | 0.8 | 1,850 | 5 | — | 100 | 240 | 4 | 0.8 | 4.3 |
| 18 | 0.8 | 1,850 | 5 | — | 100 | 230 | 4 | 0.8 | 4.5 |
| 19 | 0.8 | 1,850 | 5 | 180 | 100 | 230 | 4 | 0.8 | 4.4 |
| 20 | 0.8 | 1,850 | 5 | 200 | 100 | 230 | 4 | 0.8 | 4.5 |
| 21 | 0.8 | 1,850 | 5 | — | 100 | 240 | 4 | 0.8 | 4.4 |
| 22 | 0.8 | 1,850 | 5 | 180 | 100 | 230 | 4 | 0.8 | 4.4 |
| 23 | 0.8 | 1,850 | 5 | 200 | 100 | 230 | 4 | 0.8 | 4.4 |
| 24 | 0.8 | 1,850 | 5 | — | 100 | 230 | 4 | 0.8 | 4.4 |
| 25 | 0.8 | 1,850 | 5 | 180 | 100 | 230 | 4 | 0.8 | 4.4 |
| 26 | 0.8 | 1,850 | 5 | 200 | 100 | 230 | 4 | 0.8 | 4.4 |

Samples marked with * are Comparative Examples.

resulting slurry was spray dried to produce granulated powder having the same granulation constitution as in the granulated powder 1. Each resulting powder was molded by isostatic pressing in a rubber mold in the same manner as in the molding method 1 to provide a molded body having a diameter of 300 mm and a thickness of 7 mm.

The bulk density of the molded body was about 62% of the theoretical density of the sintered body.

After removal of the PVB, the resulting molded body was maintained in nitrogen at a temperature of 1,600° C. for 6 hours, and then gradually cooled to room temperature to obtain a sample of a sintered body. These samples of sintered bodies were evaluated for the same items as in the case of AlN in the same manner. The results obtained are shown in Table 2. The shrinkage percentages on sintering in the direction of diameter and the direction of thickness were about 17%.

TABLE 2

| No. | Relative density (%) | Thermal conductivity (W/m · K) | Defect density | Amount of sintering aid (% in terms of element) | Average particle size of main crystal (μm) |
|---|---|---|---|---|---|
| 27 | 99.5 | 18 | 5 | 7 | 5 |
| 26 | 99.5 | 20 | 5 | 7 | 5 |

The above disk shaped sintered body samples were measured without polishing for warp in the direction of diameter of the main plane and surface roughness (Rmax) of the main plane, and the values thereof were 5 μm/mm or less and 5 μm or less, respectively. The samples were subjected to finishing treatment to have a thickness within a range of 2.0±0.05 mm and a diameter within a range of 200 mm±0.5 mm, so that the warp in the direction of the main plane was about 0.25 μm/mm and the surface roughness (Rmax) was about 1 μm.

The same slurry as Sample No. 14 in Table 1 was prepared. It is provided that the binder PVB was added in an amount of 10 parts by weight per 100 parts by weight in total of the AlN powder and the sintering aid powder. In Samples Nos. 29 to 32, the slurry was subjected to a dryer of an outer steam heating type, so that the solvent content was reduced to 10% by weight, and after kneading the same, it was extruded to be a sheet having a thickness of 7 mm. The sheet was punched out to a disk shape having a diameter of 360 mm, to be an extruded molded body. Separately, extruded molded bodies in the form of a rectangular shape for measuring thermal conductivity were produced. The bulk density of the extrusion molded bodies after drying was about 66% of the theoretical density of the sintered body. These samples were subjected to drying and removal of the binder over a longer period of time than the case of Sample No. 14, and then sintered in the conditions of Table 3 described later. The shrinkage percentage on sintering in the direction of and the direction of the thickness was about 17%. The samples of the sintered bodies were measured items as in the case of AlN in the same The results obtained were shown in Table 3.

TABLE 3

| | Sintering condition | | Cooling | Relative | Thermal | | | AlN average |
|---|---|---|---|---|---|---|---|---|
| No. | Temperature (° C.) | Time (hours) | rate (° C./hr) | density (%) | conductivity (W/m · K) | Defect density | Y amount (wt %) | particle size (μm) |
| 29 | 1,850 | 5 | 180 | 100 | 240 | 4 | 0.8 | 4.1 |
| 30 | 1,850 | 5 | 200 | 100 | 240 | 4 | 0.8 | 4.2 |
| 31 | 1,850 | 5 | 300 | 100 | 240 | 3 | 0.8 | 4.2 |
| 32 | 1,850 | 5 | — | 100 | 240 | 4 | 0.8 | 4.3 |

The above disk shaped sintered samples were measured for the warp in the direction of the diameter of the main plane and the surface roughness (Rmax) of the main plain without polishing, and as a result these values were about 6 μm/mm and 5 μm or less, respectively. The samples were subjected to finishing treatments to have a thickness within the range of 2.0±0.05 mm and a diameter within the range of 200 mm±0.5 mm, and to have a warp in the direction of the main plane of about 0.25 μm/mm and the surface roughness (Rmax) of about 1 μm.

Samples Nos. 33 to 35 were the samples using the doctor blade molding method. In this molding method, the amount of the organic binder must be increased. A slurry having 20% by weight of PVB added to the powder having the same raw materials and composition as in Sample No. 14 was prepared in the same conditions. The slurry was molded with a doctor blade and subjected to heating for drying, followed by punching out. In order to obtain a product having the thickness corresponding to the final shape of this sample as described above, a molded body having a thickness of 0.9 mm and a diameter of 365 mm was produced, and 8 sheets of the molded bodies were laminated with inserting fine powder composed mainly of AlN to obtain a secondary molded body (Sample No. 33). For comparison to Sample No. 3, a secondary molded body was produced by laminating 8 sheets of the disk shaped molded bodies which had a diameter of 250 mm and the same thickness as that of Sample No. 33 and were prepared in the same procedure as Sample 33 (Sample No. 34). Similarly, a further secondary molded body was produced by laminating 8 sheets of the disk shaped molded bodies having a diameter of 100 mm and the same thickness (Sample No. 35). As similar to the above, test samples for measuring thermal conductivity were produced. The bulk density of each molded body was about 66% of the theoretical density of the sintered body. The samples were subjected to drying and removal of the binder over a longer period of time than Sample No. 14, and then sintered under the conditions shown in Table 4 below. The shrinkage percentage on sintering was about 20% in both the direction of diameter and the direction of thickness. The samples of the sintered bodies were evaluated for the same items in the case of AlN in the same manner. The results obtained are shown in Table 4.

TABLE 4

| No. | Sintering condition Temperature (° C.) | Time (hours) | Cooling rate (° C./hr) | Relative density (%) | Thermal conductivity (W/m · K) | Defect density | Y amount (wt %) | AlN average particle size (μm) |
|---|---|---|---|---|---|---|---|---|
| 33 | 1,850 | 5 | 180 | 100 | 242 | 4 | 0.8 | 4.2 |
| 34 | 1,850 | 5 | 200 | 100 | 242 | 4 | 0.8 | 4.3 |
| 35 | 1,850 | 5 | 300 | 100 | 242 | 4 | 0.8 | 4.3 |

When the disk shaped sintered samples were measured for warp in the direction of the diameter of the main plane and surface roughness (Rmax) of the main plane without polishing treatment, all the samples exhibited a surface roughness of 5 μm or less, but the warp was about 8 μm/mm in Sample No. 33, about 7 μm/mm in Sample No. 34, and about 6 μm/mm in Sample No. 35, i.e., the larger the diameter was, the larger the deformation amount on sintering was. The samples were subjected to finishing treatment to have a thickness within the range of 2.0±0.05 mm, a diameter within the range of 200 mm±0.5 mm, a warp in the direction of the main plane of about 0.25 μm/mm, and a surface roughness (Rmax) of about 1 μm.

According to the above-described data, it is understood that by controlling the amount of the sintering aid and the retaining temperature and time for the sintering within the ranges of the invention, aluminum nitride ceramics having the objective average particle size and defect density and having a thermal conductivity higher than a certain value can be obtained. A sintered body having a small warp in the stage of sintered raw material can be obtained by employing the dry molding method, in which the granulation method of the powder is appropriately modified, even if the large diameter body is desired. Accordingly, the margin for the finishing treatment can be small and the trouble for working can be omitted. Thus, it can be understood that a product suitable for the object of the invention can be obtained. This is common to ceramics other than aluminum nitride. In the extrusion molding method, the deformation amount after sintering becomes somewhat larger than the dry molding method, but a product having a large diameter meeting the object of the invention can be substantially obtained. In the case of a molding method, such as the doctor blade method, in which the amount of powder is small and the amount of the organic binder is large, the thickness of the molded body that can be molded becomes considerably thin in comparison to the above-described molding methods (dry molding method and extrusion molding method), and thus in order to produce a sintered body having a thickness corresponding to the thickness obtained by the above-described dry molding method and extrusion molding method, a large number of sheets of molded bodies have to be laminated before sintering. Furthermore, because the deformation amount of the individual sheets laminated is large, it is understood that there occurs a limitation on production and quality in that a product having a smaller diameter can be produced.

EXAMPLE 2

The same AlN powder as in Example 1; as a sintering aid, ytterbium oxide powder having an average particle size of 0.4 μm, neodymium oxide powder having an average particle size of 0.3 μm, lanthanum oxide powder having an average particle size of 0.3 μm and calcium oxide powder having an average particle size of 0.3 μm; and as an organic binder, PVB were prepared. The AlN powder and the sintering aids were weighed in such a manner that the weights of the sintering aids in terms of the respective elements were the individual amounts shown in Table 5, the total amount of which was 0.8 part by weight, and the balance was AlN. Furthermore, as an organic binder, 10% of PVB was weighed based on the total amount (100%) of them. They were mixed in an alumina pot of a ball mill using nylon balls in an ethyl alcohol solvent for 12 hours. The resulting slurry was spray dried to granulate into the granule state of almost the spherical shape, in which granules having an average particle size of 70 μm was about 22% by weight, and granules having an average particle size of 210 μm was about 78% by weight. These powder were charged in a rubber mold with vibration, and the isostatic pressing was conducted at 2 tons/cm² to mold into a shape having a diameter of 350 mm and a thickness of 7 mm. The bulk density of the resulting molded body was about 62% of the theoretical density of the sintered body.

After removal of the PVB, each of the resulting molded bodies was sintered in a nitrogen gas stream atmosphere under the same condition as in Sample No. 14 in Example 1, to obtain a sample of a sintered body. The shrinkage percentage of all the samples on sintering was about 16% in the direction of diameter and the direction of thickness. A part of the sintered bodies thus obtained was cut out as a test sample for measuring thermal conductivity, and evaluated for the same items as in Example 1. The results are shown in Table 5.

TABLE 5

| No. | Relative density (%) | Thermal conductivity (W/m · K) | Defect density | Amounts of subcomponent (% in terms of element) | | | | AlN average particle size (μm) |
|---|---|---|---|---|---|---|---|---|
| | | | | Yb | Nd | La | Ca | |
| 36 | 100 | 220 | 4 | 0.8 | — | — | — | 4.0 |
| 37 | 100 | 230 | 4 | — | 0.8 | — | — | 4.1 |
| 38 | 100 | 240 | 5 | 0.4 | 0.4 | — | — | 4.2 |
| 39 | 100 | 250 | 3 | — | — | 0.8 | — | 4.1 |
| 40 | 99 | 200 | 7 | — | — | — | 0.8 | 4.9 |
| 41 | 99 | 200 | 8 | 0.4 | — | — | 0.4 | 4.9 |

When the disk shaped sintered samples described above were measured without polishing for the surface roughness (Rmax) of the main plane, the flatness of the main plane, and the warp in the direction of diameter of the main plane, all the samples exhibited results of the same level as Sample No. 14 in Example 1. All the samples were subjected to finish treatments to have a thickness within the range of 2.0±0.05 mm, a diameter within the range of 200 mm±0.5 mm, a warp in the direction of the main plane of about 0.25 $\mu$m/mm, and a surface roughness (Rmax) of about 1 $\mu$m.

EXAMPLE 3

By using the finished substrates or the substrate samples of the molded bodies of Example 1, a susceptor was produced as a test by laminating plural sheets of these samples. As a material for the insertion layer to laminate these substrate samples, the high melting point metallic pastes added with low melting point glass compositions shown in Table 6 and the paste containing the various compositions shown in Table 7 were prepared. The numeral values in Table 6 are part by weight each final high melting point metallic layer excluding the component volatile on sintering in the paste, and the balance of the high melting point metals i.e., W, Mo and Ta, was substantially the total amount of the vitreous component. Therefore, in the case of Sample b for example, the total amount of the vitreous component in the high melting point metallic layer was 50% by weight.

TABLE 6

| Symbol of insertion layer | Component and amount (% by weight for amount) | | | Proportion of component in vitreous component | | |
|---|---|---|---|---|---|---|
| | W | Mo | Ta | $Al_2O_3$ | $SiO_2$ | CaO |
| a | 48 | — | — | 20 | 40 | 40 |
| b | 50 | — | — | 20 | 40 | 40 |
| c | 60 | — | — | 20 | 40 | 40 |
| d | 80 | — | — | 20 | 40 | 40 |
| e | 90 | — | — | 20 | 40 | 40 |
| f | 92 | — | — | 20 | 40 | 40 |
| g | — | 90 | — | 20 | 40 | 40 |
| h | — | — | 90 | 20 | 40 | 40 |
| i | 90 | — | — | 17 | 56 | 27 |
| j | 90 | — | — | 20 | 60 | 20 |
| k | 90 | — | — | 40 | 40 | 20 |
| l | 90 | — | — | 60 | 30 | 10 |
| m | 90 | — | — | 62 | 20 | 18 |
| n | 90 | — | — | 45 | 25 | 30 |
| o | 90 | — | — | 20 | 62 | 18 |
| p | 90 | — | — | 48 | 48 | 4 |
| q | 90 | — | — | 50 | 45 | 5 |
| r | 90 | — | — | 46 | 22 | 32 |

As the substrates, substrates obtained by working the sintered bodies of Sample Nos. 3, 5, 6, 7, 13, 14, 198, 28, 30 and 39 into a shape having a thickness of 2.0±0.05 mm and a diameter of 200±0.5 mm, and the molded body of Sample No. 34 before laminating were prepared. With respect to the samples of the worked substrates, a product of laminating 3 layers was produced. In each of all the samples other than Sample No. 28, the three sheets for each sample were all prepared from the substrate material of the same kind shown in Table 8. The high melting point metallic layers and the adhesive layers were combinaitons of the materials shown in Table 8. 30 samples of susceptors having the basic structure shown in FIG. 2C were prepared by using the three substrate sheets of the same kind for each sample. In the case of Sample No. 28, the substrates for the first layer and the second layer were the same substrate as in Sample No. 14, and the substrate species of Sample No. 28 was laminated as the third substrate. This sample was shown as Sample No. 74 in Table 8. With respect to the susceptor sample using the above-mentioned green body formed by the doctor blade method, three sets of a laminated molded body obtained by directly laminating 4 sheets of the molded bodies (after sintering, one set of 4 sheets were finally adhered together to form one substrate) was prepared, and the insertion layer precursor (the high melting point metallic layer and the adhesion layer) having the same combination as in Sample No. 62 in Table 8 sandwiched between the first layer and the second layer and between the second layer and the third layer. Then, they are sintered and bonded by the co-fire method in a nitrogen stream at 1,800° C. for 5 hours, and 30 susceptors comprising 3 substrates having the basic structure shown in FIG. 2A were produced in which each substrate was formed by sintering and uniting 4 sheets of the above green bodies. The original shape of each substrate layer was the same as prepared in the preceding Examples. In this case, the thicknesses of the high melting point metallic layer and the adhesive layer were adjusted so as to provide final thicknesses of about 30 $\mu$m and a thickness of 20 $\mu$m, respectively. These layers were previously formed by printing and coating their precursor layers on the substrates of the first layer and the second layer, followed by drying. In all the samples, the high melting point metallic layer on the second substrate layer was provided as the electrode in the pattern (viewed from the upper side and having an outer diameter D was 195 mm) shown in FIG. 3. In the case of Sample No. 34, the same layers having the same sintered pattern was formed on the eighth sheet of the laminated substrates. Thereafter, each assembly prepared by placing the substrate of the third layer on the uppermost part was sintered and united in a nitrogen stream. The sintering was conducted at

TABLE 7

| Symbol of insertion layer | Component and amount (% by weight for amount) | | | | | | | |
|---|---|---|---|---|---|---|---|---|
| | AlN | CaO | MgO | $Nd_2O_3$ | $Yb_2O_3$ | $La_2O_3$ | $SiO_2$ | $Al_2O_3$ |
| A | 78 | 11 | — | 11 | — | — | | |
| B | 80 | 10 | — | 10 | — | — | | |
| C | 85 | 8 | — | 7 | — | — | | |
| D | 90 | 5 | — | 5 | — | — | | |
| E | 85 | — | 8 | — | 7 | — | | |
| F | 85 | 8 | — | — | — | 7 | | |
| G | 85 | 15 | — | — | — | — | | |
| H | 85 | — | — | 15 | — | — | | |
| J | | 40 | | | | | 20 | 40 |
| K | | 30 | 10 | | | | 40 | 20 |
| L | | 30 | 20 | | | | 30 | 20 |

1,6000° C. for 1 hour for the samples using the sintered body as the starting substrate and at 1,800° C. for 5 hours for the sample using the molded body as the starting substrate.

Separately, using a test sample corresponding to each sample shown in Table 8, bonding strength (sometimes called as "peeling strength") of the high melting point metallic layer was examined. Each test sample was prepared by firing, onto on a substrate to be the first layer in the assembly, a layer comprising the high melting point metallic component to be combined therewith under the same sintering conditions as the above in which the high melting point metallic layer had a pattern of circles having a diameter of 2 mm and the same thickness as the above. In the case the sample corresponding to Sample No. 28, the bonding strength was examined in the same testing procedures, by selecting a substrate comprising alumina ceramic as the third layer. The bonding strength was measured as follows. After forming electroless nickel plating having a thickness of 1 $\mu$m on each sample, copper wires having a wire diameter of 1 mm were fixed at arbitrary three positions on the above-described circular high melting point metallic layer formed on each test sample with a Sn—Pd series solder, where the copper wire is fixed in the perpendicular direction. Thereafter, the main plane of the substrate around the fixed part was fixed horizontally, and the copper wire was pulled in the direction perpendicular to the substrate at a constant rate of 0.5 mm/sec by an Instron tensile testing machine, so as to measure its peeling strength. This boding strength (kg/mm$^2$) was obtained by dividing the applied load by the area of the foregoing circular pattern. The results obtained are shown in Table 8. The values in the table were the arithmetic mean of the measured values of the three positions.

With respect to the samples of the susceptors immediately after lamination and unification, presence or absence of void on the surface (condition in which a part of the substrate was deformed on firing to be peeled of from the bonded part), and the warp of the susceptor were examined. More specifically, after the susceptor was placed on a surface plate, the difference between the maximum distance and the minimum distance between the main plane and the surface plate was examined by scanning a dial gauge in the direction of the diameter of the main plane, and the value obtained by dividing the difference by the diameter thereof was designated as warp. With respect to the dispersion of the outer diameter D of the 30 samples of the high melting point metallic layer formed in the pattern shown in FIG. 3 after lamination, they were confirmed by the image processing by using transmission X-ray. As a result, the warp of the product obtained by laminating the molded bodies prepared by the doctor blade method was 0.7 $\mu$m/mm, whereas the product using the alumina substrate as the third layer shown as Sample No. 74 in Table 8 exhibited a warp of 0.3 $\mu$m/mm, and the other samples in the table exhibited the range of from 0.26 to 0.28 $\mu$m/mm. No void was observed in the samples shown in Table 8. The width of dispersion of the outer diameter D of the high melting point metallic layer immediately after the unification among the 30 samples was 1.2% for the product obtained by laminating the doctor blade molded bodies, whereas that for the sample shown in Table 8 was 0.2% or less.

The laminated and united samples were subjected to polish working to have a surface roughness Rmax of the upper and lower main planes of 0.08 $\mu$m, and a warp of the bonded body of about 0.25 $\mu$m/mm. The samples after working were examined for practical performance. First, separately, a disk shaped heater comprising aluminum nitride as a matrix and a W filament embedded therein was prepared. Each sample was placed in such a manner that the upper surface of its third layer was upward on a disk shaped heater and then arranged in a vacuum chamber of a plasma generation apparatus using high frequency wave of 13.56 MHz having the basic arrangement shown in FIG. 1. Each sample was then treated under an environment of a heating temperature of 100° C. and a CF$_4$ gas plasma density of 1.4 W/cm$^2$ for 5 hours. Thereafter, the density of the etching craters on the third layer of the substrate, which was exposed to the plasma, was examined in which the number of the craters having the maximum diameter of 1 $\mu$m present in an arbitrary view field of 1,000 $\mu$m$^2$ on the surface was checked by using an optical microscope. As a result, it was 20 per 1,000 $\mu$m$^2$ for Sample No. 74, in which alumina was laminated as the third layer substrate, 10 per 1,000 $\mu$m$^2$ for Sample No. 71 containing a large amount of the sintering aid, 9 per 1,000 $\mu$m$^2$ for Sample No. 72 using the substrate of Sample 13 having a low sintering density, from 4 to 5 per 1,000 $\mu$m$^2$ for Sample Nos. 68, 70 and 73, and from 2 to 3 1,000 $\mu$m$^2$ for the other samples.

TABLE 8

| | | | High melting point metallic layer | |
| --- | --- | --- | --- | --- |
| No. | Substrate number | kind | Bonding strength (kg/mm$^2$) | Kind of adhesive layer |
| 42 | 14 | a | 2.0 | C |
| 43 | * | b | 1.7 | * |
| 44 | * | c | 2.0 | * |
| 45 | * | d | 2.0 | * |
| 46 | * | e | 2.0 | * |
| 47 | * | f | 2.1 | * |
| 48 | * | g | 1.8 | * |
| 49 | * | h | 1.8 | * |
| 50 | * | i | 1.6 | * |
| 51 | * | j | 2.0 | * |
| 52 | * | k | 2.2 | * |
| 53 | * | l | 2.0 | * |
| 54 | * | m | 1.7 | * |
| 55 | * | n | 2.3 | * |
| 56 | * | o | 1.8 | * |
| 57 | * | p | 1.7 | * |
| 58 | * | q | 2.2 | * |
| 59 | * | r | 1.8 | * |
| 60 | * | k | 2.2 | A |
| 61 | * | * | 2.2 | B |
| 62 | * | * | 2.3 | C |
| 63 | * | * | 2.3 | D |
| 64 | * | * | 2.3 | E |
| 65 | * | * | 2.3 | F |
| 66 | * | * | 2.2 | G |
| 67 | * | * | 2.3 | H |
| 68 | 3 | * | 2.2 | C |
| 69 | 5 | * | 2.3 | * |
| 70 | 6 | * | 2.2 | * |
| *71 | 7 | * | 2.2 | * |
| *72 | 13 | * | 2.3 | * |
| 73 | 19 | * | 2.2 | * |
| 74 | 28 | * | 2.3 | * |
| 75 | 30 | * | 2.2 | * |
| 76 | 39 | * | 2.2 | * |
| 77 | 14 | * | 3.3 | I |
| 78 | 14 | * | 2.9 | J |
| 79 | 14 | * | 2.8 | K |

Samples marked with * are Comparative Examples.

It is understood from the results described in the foregoing that by using aluminum nitride ceramics as the substrate and specifying its molding method and firing method, it is possible to obtain a ceramic substrate excellent in corrosion resistance to plasma, dimensional precision after sintering and suitable for the use in a susceptor for preparation of a semiconductor. By laminating a plurality of the substrates with the high melting point metallic layer and the adhesive layer as the insertion layer, a ceramic susceptor of an electrostatic chucking type for semiconductor manufacturing equipment that has high dimensional precision, excellent plasma corrosion resistance, a long life, and high practical reliability that is not conventionally available can be obtained.

EXAMPLE 4

The substrate of Sample No. 14 (aluminum nitride) and the substrate of Sample No. 28 (alumina), produced in Example 1, were prepared. These substrates were subjected to working to have a thickness of 2.0±0.05 mm and a diameter of 200±0.5 mm. The surface roughness of each sample was almost the same as described before. Then, a laminate (Sample A) constituted of three sheets of the substrate of Sample 14 and another laminate (Sample B) constituted two sheets of the substrate of Sample 14 and one sheet of the substrate of Sample 28 laminated as the uppermost surface layer thereon were prepared. The insertion layer was a combination of "a" and "C" shown in Table 8 for both laminates. After lamination and unification were conducted under the conditions set forth in Example 3, a diamond layer having a thickness of 5 μm was applied onto the main face of the uppermost layer as follows. The surface of the uppermost layer substrate was finished with a diamond grinder (#5000) to make the uppermost surface slightly rough and each of the thus treated laminates was placed a vacuum chamber. Then, the surface of the uppermost substrate layer was coated with a diamond layer by CVD (Chemical Vapor Deposition) using a heater filament, in which the raw material gas composed of a mixed gas of 2% methane and 98% hydrogen was introduced at a pressure of 70 Torr. The temperature of the substrate was 800° C., and the filament temperature was 2,000° C. Thereafter, the diamond-coated surface and the lowermost surface of each laminate were so finished by polishing that they have a surface roughness of Rmax of 0.08 μm and the warp of each laminate was about 0.25 μm/mm as a whole. The final thickness of the diamond layer was within the range of from 30 to 32 μm for each substrate. Then, each sample was examined in the arrangement shown in FIG. 1 for plasma corrosion resistance in the same manner as set forth in Example 3. As a result, Samples A and B exhibited almost the same results as previously described for the substrates of Sample No. 28 and Sample No. 14, respectively.

Further, each laminate was heated to 100° C. by a lower heater to measure the temperature distribution of the uppermost layer. For comparison, Samples A' and B' free from the diamond layer were further prepared corresponding to Samples A and B, respectively. The temperature of each sample was measured by means of a noncontact type thermograph. The results are shown in Table 9. As shown from the results in the table, the temperature distribution was greatly improved by coating diamond.

TABLE 9

| | Temperature distribution | | |
|---|---|---|---|
| Sample | Maximum temperature (° C.) | Minimum temperature (° C.) | Difference in temperature (° C.) |
| A | 97.3 | 96.9 | 0.4 |
| A' | 98.1 | 94.1 | 3.4 |

TABLE 9-continued

| | Temperature distribution | | |
|---|---|---|---|
| Sample | Maximum temperature (° C.) | Minimum temperature (° C.) | Difference in temperature (° C.) |
| B | 96.6 | 95.2 | 1.4 |
| B' | 97.8 | 91.1 | 6.7 |

EXAMPLE 5

Using each of the laminates prepared in Examples 3 and 4 as a susceptor, a pattern of an insulating films composed of silicon nitride was successively formed on many silicon semiconductor wafers, each having an outer diameter slightly less than 200 mm. The sizes of the pattern formed on the wafers, the insulation between the patterns, the defects on the susceptor surface, and the wearing and life of the susceptor were examined after surface treating every several hundreds of wafers. As a result, their overall evaluation was as follows. Among the susceptors using only the substrates of AlN, Sample A of Example 4 exhibited the best results and the order after this best Sample A was as follows, i.e., the susceptor using the substrate of Sample 14 (e.g., Sample A' in Example 4) and Sample 73 (using the substrate of Sample 19), Sample 75 (using the substrate of Sample 30), Sample 76 (using the substrate of Sample 39), Sample 68 (using the substrate of Sample 3), Sample 70 (using the substrate of Sample 6) and Sample 71 (using the substrate of Sample 7). The life of the susceptor using the substrate of Sample 14 was at least twice that of the susceptor of Sample 71. With respect to the susceptors using the substrate of $Al_2O_3$ as the uppermost layer, the susceptor of Sample B of Example 4 was superior to the susceptor of Sample 74 (i.e., Sample B' of Example 4). The life of the susceptor using only the substrate of AlN was longer than several times that of the susceptor using the substrate of $Al_2O_3$ as the uppermost layer.

According to the invention, by laminating a plurality of the substrates with the high melting point metallic layer and the oxide glass adhesive layer as the insertion layer, an electrostatic chuck having high dimensional precision and excellent plasma corrosion resistance that is not conventionally available can be provided. In particular, by using the aluminum nitride ceramics containing 1% by weight or less of a compound of at least one of Group 3a elements and the balance being substantially AlN, the average particle size of which is controlled to the range of from 2 to 5 μm as the substrate, a susceptor for semiconductor manufacturing equipment having an electrostatic chuck having high practical reliability can be provided.

What is claimed is:

1. A susceptor for semiconductor manufacturing equipment retaining a semiconductor raw material by electrostatic charge, which comprises plural substrates, at least two of said substrates being aluminum nitride ceramic, and laminated with sandwiching of an insertion layer between adjacent ones of the substrates, the insertion layer consisting of a high melting point metallic layer provided with a pattern as an electrode layer and an electrically insulating adhesive layer for adhering the high melting point metallic layer and substrate.

2. A susceptor for semiconductor manufacturing equipment as defined in claim 1, wherein said aluminum nitride ceramic comprises from 0.01 to 1% by weight of a Group 3a element and an average particle size of an AlN crystal is from 2 to less than 5 μm.

3. A susceptor for semiconductor manufacturing equipment as defined in claim 2, wherein a thermal conductivity of said aluminum nitride ceramic substrate is 150 W/m·K or more.

4. A susceptor for semiconductor manufacturing equipment as defined in claim 1, wherein a ceramic other than aluminum nitride ceramic is used as an uppermost substrate of the laminated substrates.

5. A susceptor for semiconductor manufacturing equipment as defined in claim 1, wherein an uppermost substrate of said laminated substrates is coated with a diamond layer.

6. A susceptor for semiconductor manufacturing equipment as defined in claim 1, wherein said substrate has equipment as defined in claim 1, wherein said substrate has 5 or less of pores having a maximum diameter exceeding 1 μm at a triple point of grain boundaries in an arbitrary rupture section of 1,000 μm².

7. A susceptor for semiconductor manufacturing equipment as defined in claim 1, wherein said high melting point metallic layer comprises at least one element selected from the group consisting of W, Mo and Ta.

8. A susceptor for semiconductor manufacturing equipment as defined in claim 7, wherein said high melting point metallic layer comprises a low melting point glass.

9. A susceptor for semiconductor manufacturing equipment as defined in claim 8, wherein said low melting point glass is an oxide glass comprising at least one element selected from the group consisting of Ca, Al and Si.

10. A susceptor for semiconductor manufacturing equipment as defined in claim 1, wherein said adhesive layer comprises 80% by weight or more of aluminum nitride (AlN) and the balance consisting essentially of a compound of an element of Group 2a and an element of Group 3a of the periodic table.

11. a susceptor for semiconductor manufacturing equipment as defined in claim 8, wherein said adhesive layer comprises the same oxide gas as the low melting point glass included in the high melting point metallic layer.

12. A susceptor for semiconductor manufacturing equipment as defined in claim 11, wherein said low melting point glass is an oxide glass comprising at least one selected from the group consisting of Ca, Al and Si.

13. A susceptor for semiconductor manufacturing equipment as defined in claim 1, wherein a warp in a direction of a main plane is 0.3 μm/mm or less.

14. A susceptor for semiconductor manufacturing equipment as defined in claim 1, wherein a dispersion width of an outer dimension in a direction of a main plane of a pattern of said high melting point metallic layer is 1% or less.

* * * * *